United States Patent
Long

(10) Patent No.: US 12,159,770 B2
(45) Date of Patent: Dec. 3, 2024

(54) COOLED SHIELD FOR ICP SOURCE

(71) Applicants: Mattson Technology, Inc., Fremont, CA (US); Beijing E-Town Semiconductor Technology Co., Ltd., Beijing (CN)

(72) Inventor: Maolin Long, Santa Clara, CA (US)

(73) Assignees: Beijing E-Town Semiconductor Technology Co., Ltd., Beijing (CN); Mattson Technology, Inc., Fremont, CA (US)

( * ) Notice: Subject to any disclaimer, the term of this patent is extended or adjusted under 35 U.S.C. 154(b) by 388 days.

(21) Appl. No.: 17/544,139

(22) Filed: Dec. 7, 2021

(65) Prior Publication Data

US 2022/0208527 A1   Jun. 30, 2022

Related U.S. Application Data

(60) Provisional application No. 63/195,923, filed on Jun. 2, 2021, provisional application No. 63/130,988, filed on Dec. 28, 2020.

(51) Int. Cl.
  *H01J 37/32*   (2006.01)
(52) U.S. Cl.
  CPC ...... *H01J 37/32522* (2013.01); *H01J 37/321* (2013.01); *H01J 37/32651* (2013.01)
(58) Field of Classification Search
  CPC .............. H01J 37/32522; H01J 37/321; H01J 37/32651
  USPC ................................................ 156/345.37
  See application file for complete search history.

(56) References Cited

U.S. PATENT DOCUMENTS

| | | | | |
|---|---|---|---|---|
| 6,068,784 | A * | 5/2000 | Collins | ............... H01J 37/321 257/E21.252 |
| 6,238,588 | B1 * | 5/2001 | Collins | ............ H01L 21/02063 438/719 |
| 6,706,142 | B2 | 3/2004 | Savas et al. | |
| 8,525,419 | B2 | 9/2013 | Smith et al. | |
| 8,801,947 | B2 | 8/2014 | Wang et al. | |
| 9,184,072 | B2 * | 11/2015 | Devine | ............ H01L 21/67069 |
| 10,049,858 | B2 | 8/2018 | Nagorny et al. | |
| 2001/0003271 | A1 * | 6/2001 | Otsuki | ............. H01J 37/32477 156/914 |

(Continued)

FOREIGN PATENT DOCUMENTS

| | | |
|---|---|---|
| CN | 108573847 | 9/2018 |
| WO | WO 2021/011771 | 1/2021 |

*Primary Examiner* — Charlee J. C. Bennett
(74) *Attorney, Agent, or Firm* — Dority & Manning, P.A.

(57) ABSTRACT

Provided is a plasma processing apparatus or system including a plasma chamber and an inductively coupled plasma source. A shielding device is disposed between the plasma chamber the inductively coupled plasma source. The shielding device includes a top annular portion, a bottom annular portion, and a plurality of thermal pads coupled to top annular portion and/or bottom annular portion with one or more retaining members. The one or more retaining members provide a compressive force to secure the one or more thermal pads against the outer surface of the dielectric wall. The plurality of thermal pads are configured to modulate a heat flux from the dielectric wall into the respective thermal pad. Methods of processing workpieces are also disclosed.

16 Claims, 15 Drawing Sheets

(56) References Cited

U.S. PATENT DOCUMENTS

| | | | |
|---|---|---|---|
| 2013/0196510 A1* | 8/2013 | George | H01L 21/6715 |
| | | | 438/758 |
| 2015/0024594 A1* | 1/2015 | Fischer | H01J 37/32715 |
| | | | 438/758 |
| 2016/0013025 A1* | 1/2016 | Nagorny | H01J 37/32513 |
| | | | 118/50.1 |
| 2017/0200585 A1* | 7/2017 | Wang | H01F 27/28 |
| 2017/0243721 A1 | 8/2017 | Nagorny et al. | |
| 2018/0286639 A1 | 10/2018 | Zucker et al. | |
| 2018/0358204 A1 | 12/2018 | Ma et al. | |
| 2019/0108974 A1* | 4/2019 | Rogers | H01J 37/32449 |
| 2020/0043775 A1 | 2/2020 | Savas | |
| 2020/0075313 A1 | 3/2020 | Wang et al. | |
| 2020/0194277 A1 | 6/2020 | Dai et al. | |
| 2020/0227239 A1 | 7/2020 | Savas et al. | |
| 2021/0050213 A1 | 2/2021 | Savas et al. | |
| 2021/0066054 A1* | 3/2021 | Chen | H01J 37/3211 |
| 2022/0208529 A1* | 6/2022 | Long | H01J 37/321 |

* cited by examiner

COOLED SHIELD FOR ICP SOURCE

PRIORITY CLAIM

The present application claims the benefit of priority of U.S. Provisional Application Ser. No. 63/130,988, titled "Cooled Faraday Shield for ICP Source," filed on Dec. 30, 2020, which is incorporated herein by reference. The present application claims the benefit of priority of U.S. Provisional Application Ser. No. 63/195,923, titled "Cooled Shield for ICP Source," filed on Jun. 2, 2021, which is incorporated herein by reference.

FIELD

The present disclosure relates generally to apparatus, systems, and methods for plasma processing of a workpiece.

BACKGROUND

Plasma processing is widely used in the semiconductor industry for deposition, etching, resist removal, and related processing of semiconductor wafers and other substrates. Plasma sources (e.g., microwave, ECR, inductive coupling, etc.) are often used for plasma processing to produce high density plasma and reactive species for processing substrates. In plasma dry strip processes, neutral species (e.g., radicals) from a plasma generated in a remote plasma chamber pass through a separation grid into a processing chamber to treat a workpiece, such as a semiconductor wafer. In plasma etch processes, radicals, ions, and other species generated in a plasma directly exposed to the workpiece can be used to etch and/or remove a material on a workpiece.

SUMMARY

Aspects and advantages of embodiments of the present disclosure will be set forth in part in the following description, or may be learned from the description, or may be learned through practice of the embodiments.

Aspects of the present disclosure are directed to a plasma processing apparatus including a plasma chamber including a dielectric wall having an outer surface and an inductively coupled plasma chamber configured to generate a plasma in the plasma chamber. The apparatus further includes a shielding device disposed between the outer surface of the dielectric wall and the inductively coupled plasma source. The shielding device includes a top annular portion, a bottom annular portion, and a plurality of thermal pads coupled to top annular portion and/or bottom annular portion with one or more retaining members. The one or more retaining members provide a compressive force to secure the one or more thermal pads against the outer surface of the dielectric wall. Further, the plurality of thermal pads are configured to modulate a heat flux from the dielectric wall into the respective thermal pad. Aspects of the present disclosure are also directed to a plasma processing system including a plasma chamber including a dielectric wall having an outer surface and an inductively coupled plasma chamber configured to generate a plasma in the plasma chamber. The apparatus further includes a shielding device disposed between the outer surface of the dielectric wall and the inductively coupled plasma source. The shielding device includes a top annular portion, a bottom annular portion, and a plurality of thermal pads coupled to top annular portion and/or bottom annular portion with one or more retaining members. The one or more retaining members provide a compressive force to secure the one or more thermal pads against the outer surface of the dielectric wall. Further, the plurality of thermal pads are configured to modulate a heat flux from the dielectric wall into the respective thermal pad. The system further includes a temperature measurement system configured to monitor the temperature of the dielectric wall and a controller. The controller is configured to perform one or more operations. The one or more operations include modulating a fluid flow of thermal exchange fluid to one or more of the plurality of thermal pads, and/or modulating a power input to the inductively coupled plasma source.

Aspects of the present disclosure are also directed to a method of processing a workpiece. The method includes placing a workpiece on a workpiece support disposed in a processing chamber of a plasma processing apparatus and generating a plasma with an inductively coupled plasma source in a plasma chamber of the plasma processing apparatus, the plasma chamber including a dielectric wall. The method also includes exposing the workpiece to one or more species in the plasma to provide a treatment process for the workpiece, and shielding the plasma chamber from the inductively coupled plasma source with a shielding device. The shielding device includes a top annular portion, a bottom annular portion, and a plurality of thermal pads coupled to top annular portion and/or bottom annular portion with one or more retaining members. The one or more retaining members provide a compressive force to secure the one or more thermal pads against an outer surface of the dielectric wall. The plurality of thermal pads are configured to modulate a heat flux from the dielectric wall into the respective thermal pad.

These and other features, aspects and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
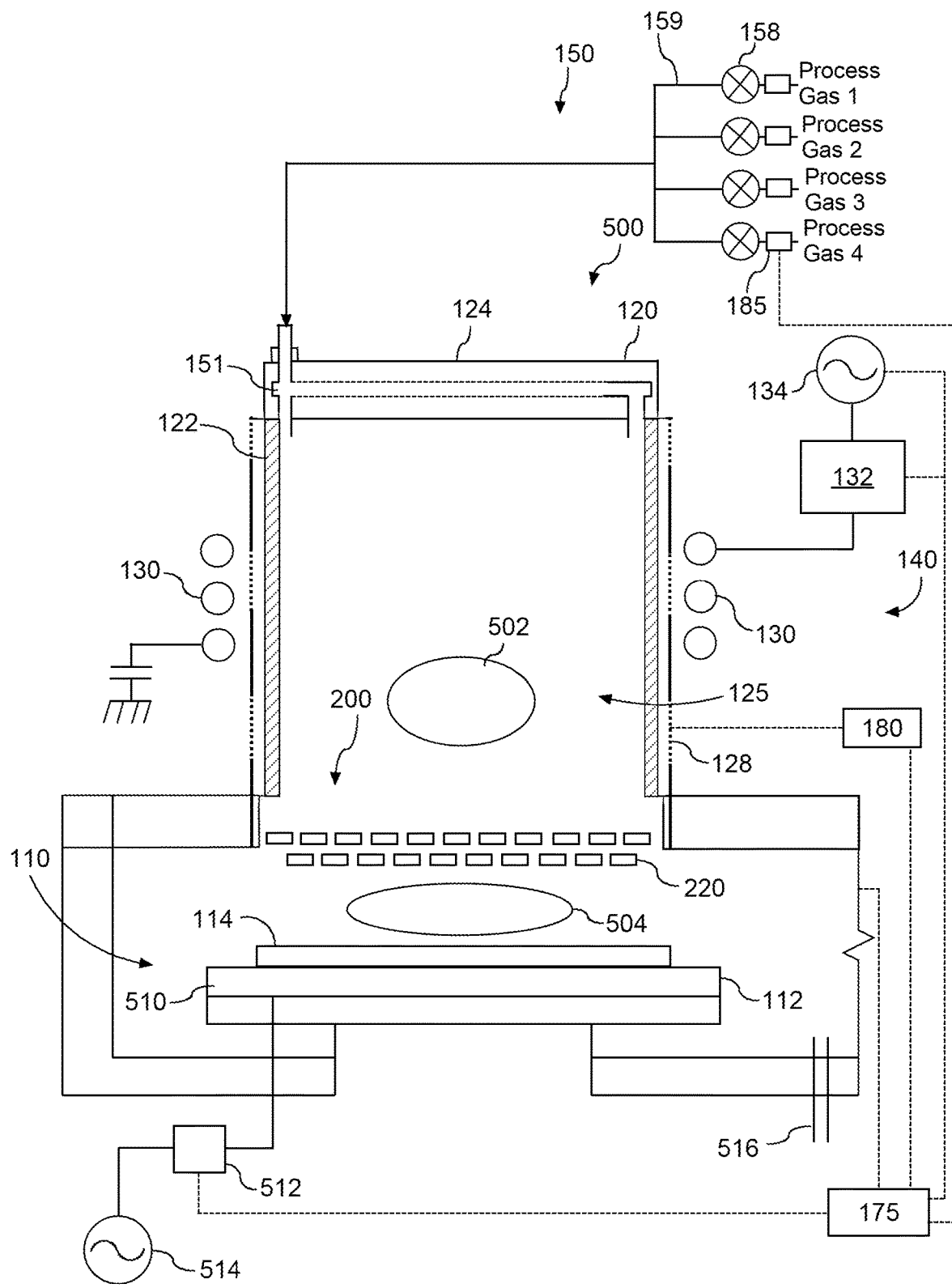
FIG. 1 depicts an example plasma processing apparatus according to example embodiments of the present disclosure.

Example aspects of the present disclosure are directed to an electromagnetic shield (e.g., Faraday shield) for a plasma source that additionally provides for heat removal from the plasma source. Some prior designs of plasma sources suffer from problems relating to overheating. For instance, plasma sources can include a dielectric chamber or tube within which the plasma is contained. In high power applications, the energy transmitted through the dielectric material to energize the plasma heats the dielectric material and causes material degradation, in some cases leading to failure or breach (e.g., cracking of ceramic dielectric chamber). The problem is compounded for inductively coupled plasma sources, which can generally include a high-power inductive coil encircling a dielectric tube. In such configurations, the area generally exposed to the highest heat is the area located nearby the inductive coil. Thus, it may be desirable to shield the dielectric chamber from the coil using, for example, a Faraday shield, to limit capacitive coupling between the inductive coil and the plasma within the dielectric chamber. Providing for cooling of the dielectric chamber while also shielding the dielectric chamber from the coil poses particular challenges. One solution includes increasing the coil diameter in order to accommodate both a cooling jacket and a shield. However, such a modification can decrease RF power efficiency, reduce the striking and process windows, generate higher RF voltages, and increase coil arcing risk.

In some embodiments, a shield according to aspects of the present disclosure can comprise a plurality of thermal pads partially or completely surrounding and contacting the dielectric wall of the plasma chamber. By connecting the thermal pads to each other and to a desired reference potential (e.g., a ground, a floating reference, etc.), a conductive "cage" can encircle the dielectric chamber to provide a desired shielding effect.

In some examples, the thermal pads can also be connected to a heat sink (e.g., a conductive heat sink, convective heat sink, radiative heat sink, and/or combination thereof). In some embodiments, each thermal pad is individually connected to a heat sink. For example, each thermal pad can include cooling channels ported for flowing a heat exchange fluid (e.g., coolant). In this manner, each thermal pad can be provided with thermal exchange fluid individually, such that the heat extracted from each of the thermal pads can be monitored and/or controlled by controlling the flow of thermal exchange fluid through each. In some embodiments, the tubing providing thermal exchange fluid to the thermal pads can be formed from dielectric material that is transparent to the RF field emitted from the ICP source coil. In this manner, flexible tubing can be used to reduce the likelihood of coolant leaks due to thermal expansion and contraction.

In some examples, the thermal pads can be elastically suspended from a housing of the plasma source to maintain a desired contact pressure on the dielectric chamber to provide for adequate heat transfer. The elastic mounting of the thermal pads can be configured with sufficient range of motion to accommodate thermal expansion and contraction of the dielectric wall. Additionally, the elastic mounting can be configured such that the expected operating position of the thermal pad (e.g., after the dielectric chamber has expanded to operating size at its operating temperature) lies within a linear range of the elastic mounting, such that the contact pressure between the thermal pad and the dielectric wall is substantially constant as the dielectric wall expands and contracts during the operation cycle. In this manner, the pressures exerted on the dielectric wall can be managed to remain less than any critical threshold (e.g., associated with damage to any part of the plasma source and/or its housing), while sufficient pressure is maintained to provide for adequate heat transfer from the dielectric wall.

In some embodiments, the elastic mounting can form part of the conductive shield. For instance, a thermal pad can be suspended from a grounded housing or frame of the plasma source by a conductive retaining member (e.g., an elastic strap). For instance, one or more copper straps (e.g., beryllium copper, optionally silver-plated) can be preformed such that, once installed to suspend the thermal pad against the side of the dielectric wall, the retaining members are elastically deformed to clamp the thermal pad against the side of the dielectric chamber.

Accordingly, aspects of the present disclosure provide a number of technical effects and benefits. Advantageously, devices and systems according to example aspects of the present disclosure provide for a shield for a plasma source that additionally provides for heat removal from a dielectric chamber containing the generated plasma. Of further advantage, embodiments of shields according to certain aspects of the present disclosure can accommodate thermal "breathing" of the dielectric chamber as it expands and contracts due to changes in temperature while maintaining good thermal conductivity between the shield and the dielectric chamber. In addition to accommodating the thermal expansion and contraction, embodiments of shields according to aspects of the present disclosure can provide for more even temperature distributions around the circumference of the dielectric chamber, helping to mitigate excess thermally-induced material stresses within the walls of the dielectric chamber. Furthermore, embodiments of the present disclosure can reduce production costs by reducing manufacturing complexity. For example, porting each thermal pad for coolant flow can be accomplished more cheaply than porting a standard Faraday cage.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Aspects of the present disclosure are discussed with reference to a "workpiece" "wafer" or semiconductor wafer for purposes of illustration and discussion. Those of ordinary skill in the art, using the disclosures provided herein, will understand that the example aspects of the present disclosure can be used in association with any semiconductor workpiece or other suitable workpiece. In addition, the use of the term "about" in conjunction with a numerical value is intended to refer to within ten percent (10%) of the stated numerical value. A "pedestal" refers to any structure that can be used to support a workpiece. A "remote plasma" refers to a plasma generated remotely from a workpiece, such as in a plasma chamber separated from a workpiece by a separation grid. A "direct plasma" refers to a plasma that is directly exposed to a workpiece, such as a plasma generated in a processing chamber having a pedestal operable to support the workpiece.

FIG. 1 depicts an example plasma processing apparatus 500 that can be used to implement processes according to example embodiments of the present disclosure. The plasma processing apparatus includes a processing chamber 110 and a plasma chamber 120 that is separated from the processing chamber 110. Processing chamber 110 includes a workpiece support 112 or pedestal operable to hold a workpiece 114 to be processed, such as a semiconductor wafer. In this example illustration, a plasma 502 is generated in plasma chamber 120 (i.e., plasma generation region) by an inductively coupled plasma source 135 and desired species are channeled from the plasma chamber 120 to the surface of workpiece 114 through a separation grid assembly 200.

The plasma chamber 120 includes a dielectric side wall 122 and a ceiling 124. The dielectric side wall 122, ceiling 124, and separation grid 200 define a plasma chamber interior 125. Dielectric side wall 122 can be formed from a dielectric material, such as quartz and/or alumina. Dielectric side wall 122 can be formed from a ceramic material. The dielectric wall 122 can include an outer surface that does not face the plasma chamber interior 125. The inductively coupled plasma source 135 can include a source coil assembly such as an induction coil 130 disposed adjacent the dielectric side wall 122 about the plasma chamber 120. The induction coil 130 is coupled to an RF power generator 134 through a suitable matching network 132. The plasma processing apparatus 500 can include a shielding device 128 (e.g., a grounded Faraday shield) around the plasma chamber 120 (e.g., to reduce capacitive coupling of the induction coil 130 to the plasma 502).

Process gases can be provided to the chamber interior from gas supply 150 and annular gas distribution channel 151 or other suitable gas introduction mechanism. According to example aspects of the present disclosure, the apparatus 100 can include a gas delivery system 155 configured to deliver process gas to the plasma chamber 120, for instance, via a gas distribution channel 151 or other distribution system (e.g., showerhead). The gas delivery system 155 can include a plurality of feed gas lines 159. The feed gas lines 159 can be controlled using valves 158 and/or gas flow controllers 185 to deliver a desired amount of gases into the processing chamber 109 as process gas. The gas delivery system 155 can be used for the delivery of any suitable process gas (e.g., process gas 1, process gas 2, process gas 3, process gas 4, etc.). Example process gases include oxygen-containing gases (e.g. $O_2$, $O_3$, $N_2O$, $H_2O$), hydrogen-containing gases (e.g., $H_2$, $D_2$), nitrogen-containing gas (e.g. $N_2$, $NH_3$, $N_2O$), fluorine-containing gases (e.g. $CF_4$, $C_2F_4$, $CHF_3$, $CH_2F_2$, $CH_3F$, $SF_6$, $NF_3$), hydrocarbon-containing gases (e.g. $CH_4$), or combinations thereof. Other feed gas lines containing other gases can be added as needed. In some embodiments, the process gas can be mixed with an inert gas that can be called a "carrier" gas, such as He, Ar, Ne, Xe, or $N_2$. A control valve 158 can be used to control a flow rate of each feed gas line to flow a process gas into the plasma chamber 120. In embodiments, the gas delivery system 155 can be controlled with a gas flow controller 185.

Further, as shown in FIG. 1, a separation grid 200 separates the plasma chamber 120 from the processing chamber 110. The separation grid 200 can be used to perform ion filtering from a mixture generated by plasma in the plasma chamber 120 to generate a filtered mixture. The filtered mixture can be exposed to the workpiece 114 in the processing chamber. In some embodiments, the separation grid 200 can be a multi-plate separation grid. For instance, the separation grid 200 can include a first grid plate 210 and a second grid plate 220 that are spaced apart in parallel relationship to one another. The first grid plate 210 and the second grid plate 220 can be separated by a distance.

The first grid plate 210 can have a first grid pattern having a plurality of holes. The second grid plate 220 can have a second grid pattern having a plurality of holes. The first grid pattern can be the same as or different from the second grid pattern. Charged particles can recombine on the walls in their path through the holes of each grid plate 210, 220 in the separation grid. Neutral species (e.g., radicals) can flow relatively freely through the holes in the first grid plate 210 and the second grid plate 220. The size of the holes and thickness of each grid plate 210 and 220 can affect transparency for both charged and neutral particles.

In some embodiments, the first grid plate 210 can be made of metal (e.g., aluminum) or other electrically conductive material and/or the second grid plate 220 can be made from either an electrically conductive material or dielectric material (e.g., quartz, ceramic, etc.). In some embodiments, the first grid plate 210 and/or the second grid plate 220 can be made of other materials, such as silicon or silicon carbide. In the event a grid plate is made of metal or other electrically conductive material, the grid plate can be grounded.

For instance, separation grid assembly 200 can be used to filter ions generated by the plasma. The separation grid 200 can have a plurality of holes. Charged particles (e.g., ions) can recombine on the walls in their path through the plurality of holes. Neutral species (e.g. radicals) can pass through the holes.

In some embodiments, the separation grid 200 can be configured to filter ions with an efficiency greater than or equal to about 90%, such as greater than or equal to about 95%. A percentage efficiency for ion filtering refers to the number of ions removed from the mixture relative to the total number of ions in the mixture. For instance, an efficiency of about 90% indicates that about 90% of the ions are removed during filtering. An efficiency of about 95% indicates that about 95% of the ions are removed during filtering.

In some embodiments, the separation grid 200 can be a multi-plate separation grid. The multi-plate separation grid can have multiple separation grid plates in parallel. The arrangement and alignment of holes in the grid plate can be selected to provide a desired efficiency for ion filtering, such as greater than or equal to about 95%.

For instance, the separation grid 200 can have a first grid plate 210 and a second grid plate 220 in parallel relationship with one another. The first grid plate 210 can have a first grid pattern having a plurality of holes. The second grid plate 220 can have a second grid pattern having a plurality of holes. The first grid pattern can be the same as or different from the second grid pattern. Charged particles (e.g., ions) can recombine on the walls in their path through the holes of each grid plate 210, 220 in the separation grid 200. Neutral species (e.g., radicals) can flow relatively freely through the holes in the first grid plate 210 and the second grid plate 220.

In embodiments, the apparatus 500 can include a controller 175. The controller 175 controls various components of the apparatus 500 to direct processing of workpiece 114. For example, controller 175 can be used to control power sources (e.g., DC power source, AC power source, and/or RF power source) connected to the induction coil 130. Additionally and/or alternatively, controller 175 can be in communication (e.g., wireless communication) with a temperature measurement system 180 configured to measure the temperature of the plasma chamber 120 and/or dielectric wall 122. Based on dielectric wall 122 temperatures, the controller 175 can adjust the flow of heat exchange fluid through one or more of the thermal pads disposed on the shield 128, as will be further discussed hereinbelow. The controller 175 can be configured to maintain a certain dielectric wall temperature 122 for the plasma chamber 120. The controller 175 can also implement one or more process parameters, such as controlling the gas flow controllers 185 and/or altering conditions of the plasma chamber 120 and/or processing chamber 110 during processing of the workpiece 114. The controller 175 can include, for instance, one or more processors and/or one or more memory devices. The one or more memory devices can store computer-readable instructions that, when executed by the one or more processors, cause the one or more processors to perform operations, such as any of the control operations described herein.

In some embodiments, the workpiece support 112 can be movable in a vertical direction V. For instance, the workpiece support 112 can include a vertical lift that can be configured to adjust a distance between the workpiece support 112 and the separation grid assembly 200. As one example, the workpiece support 112 can be located in a first vertical position for processing using the remote plasma 502. The workpiece support 112 can be in a second vertical position for processing using the direct plasma 504. The first vertical position can be closer to the separation grid assembly 200 relative to the second vertical position.

The example plasma processing apparatus 500 of FIG. 1 is operable to generate a first plasma 502 (e.g., a remote plasma) in the plasma chamber 120 and a second plasma 504 (e.g., a direct plasma) in the processing chamber 110. More particularly, the plasma processing apparatus 500 of FIG. 1 includes a bias source having a bias electrode 510 in the workpiece support 112. The bias electrode 510 can be coupled to an RF power generator 514 via a suitable matching network 512. When the bias electrode 510 is energized with RF energy, a second plasma 504 can be generated from a mixture in the processing chamber 110 for direct exposure to the workpiece 114. The processing chamber 110 can include a gas exhaust port 516 for evacuating a gas from the processing chamber 110. The radicals or species used in the during workpiece processing according to example aspects of the present disclosure can be generated using the first plasma 502 and/or the second plasma 504.

The RF generators 134 and 514 are operable at various frequencies. In some embodiments, for example, the RF generator 134 can energize the induction coil 130 (and additionally, or alternatively, the RF generator 514 can energize the bias electrode 510) with RF power at frequency of about 13.56 MHz. In certain example embodiments, the RF generator(s) may be operable to provide RF power at frequencies in a range between about 400 KHz and about 60 KHz.

Figure 2:
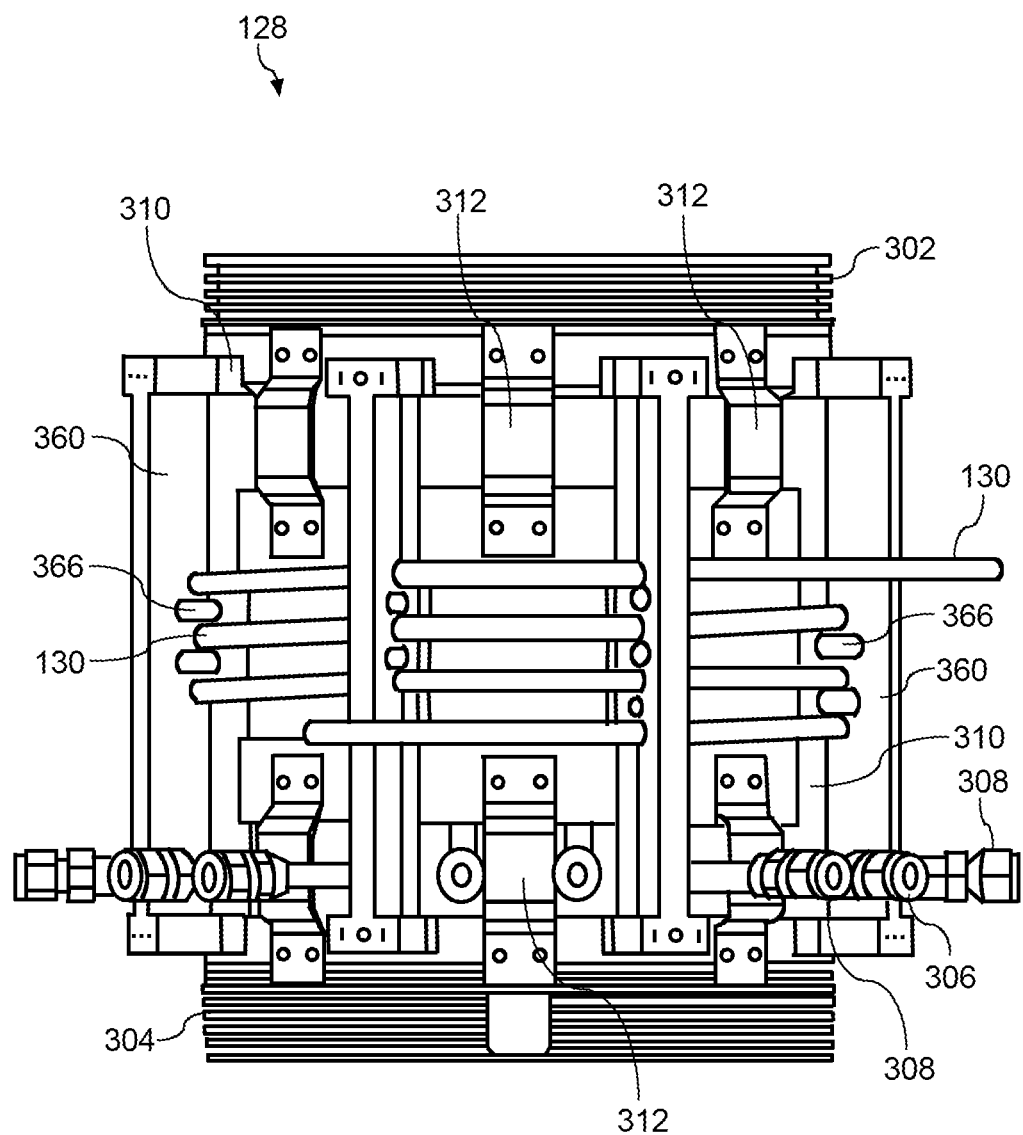
FIG. 2 depicts a profile view of an example shield according to example embodiments of the present disclosure.
Figure 3:
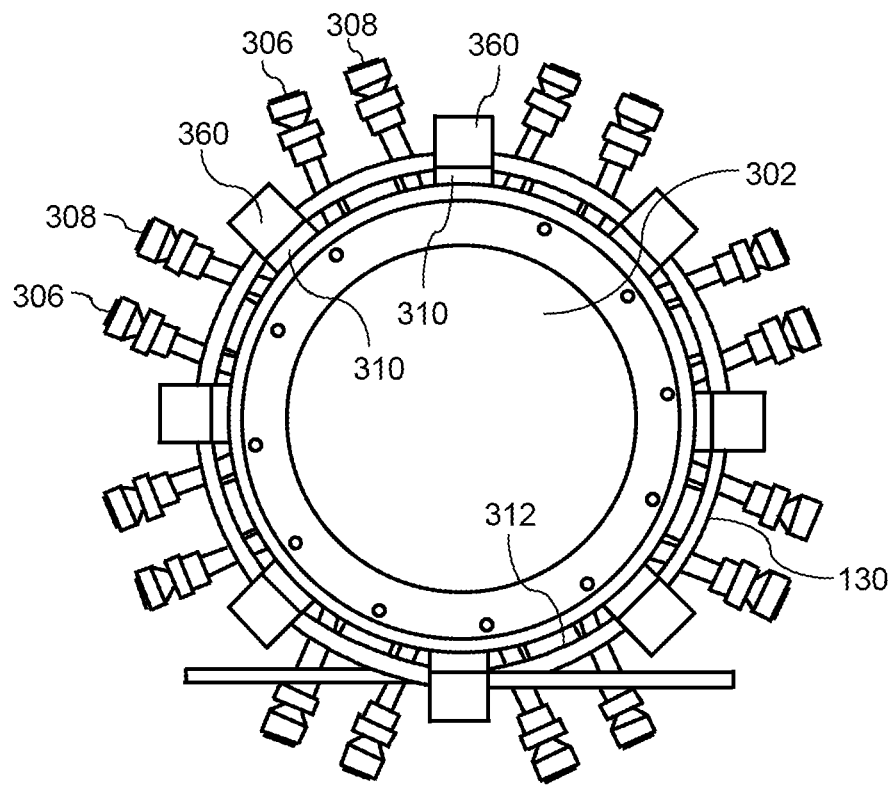
FIG. 3 depicts a top view of an example shield according to example embodiments of the present disclosure.
Figure 4:
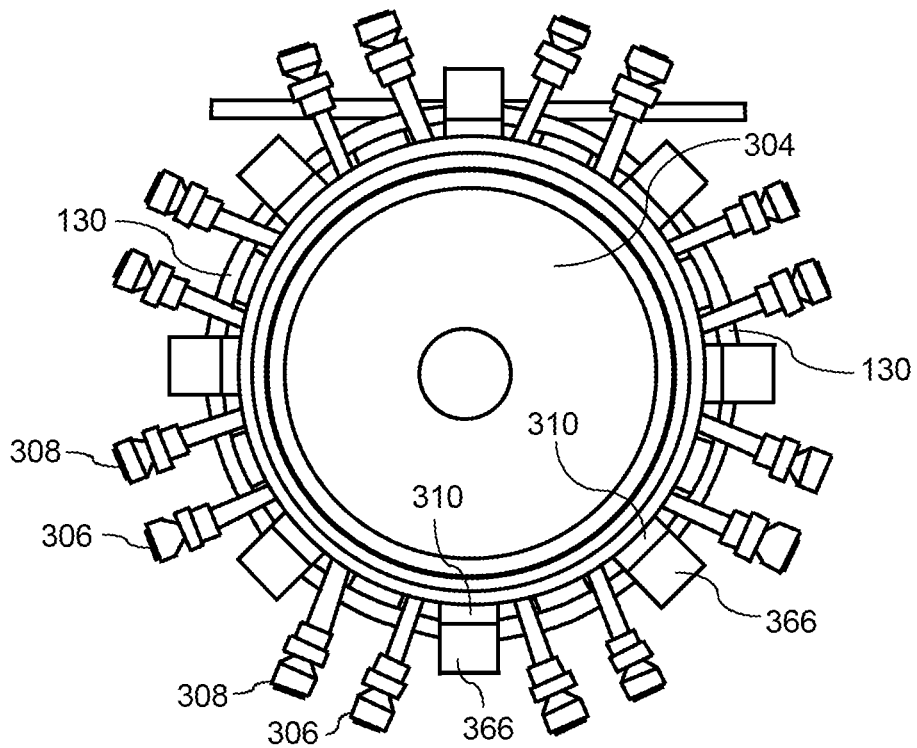
FIG. 4 depicts a bottom view of an example shield according to example embodiments of the present disclosure.

Example embodiments of a shield 128 and features of the shield 128 will now be discussed with reference to FIGS. 2-17. For example, referring now to FIG. 2, illustrated is an example embodiment of a shield 128 capable of conveying heat away from plasma chamber 120 via dielectric wall 122. For example, the shield, 128 includes one or more thermal pads 300. In one embodiment, as shown, the shield 128 is built around a top annular portion 302 and a bottom annular portion 304. Each of the top annular portion 302 and bottom annular portion 304 respectively terminate and encircle the plasma chamber 120. The top annular portion 302 and bottom annular portion 304 can be configured with a variety of mounting features (e.g., mounting flanges) for mounting brackets 310 and/or retaining members 312 thereon, as will be further discussed below. The thermal pads 300 are configured to be attached to both the top annular portion 302 and the bottom annular portion 304 with one or more retaining members 312 as will be further discussed herein. The thermal pads 300 are generally configured to modulate a heat flux from the plasma chamber 120 (e.g., the dielectric wall 122) into the respective thermal pad 300. One or more fluid inlets 306 and fluid outlets 308 can be coupled to the thermal pads 300 in order to circulate a heat exchange fluid through the thermal pads 300, as will be discussed further hereinbelow. Mounting brackets 310 are also disposed between the top annular portion 302 and bottom annular portion 304 for supporting an induction coil assembly (e.g., induction coil 130). The induction coil 130 can be supported by the combination of the mounting brackets 310 and mounting bracket faceplates 360. Furthermore, one or more apertures 366 are disposed in the mounting bracket 310. FIGS. 3 and 4 illustrate a top-down view and a bottom-up view of the shield 128 as shown in FIG. 2, respectively.

Materials used to form portions of the shield 128 can include any suitable metal material or combinations of metal materials. For example, the top annular portion 302 and bottom annular portion 304 can be formed from copper materials, aluminum materials, or combinations thereof. In embodiments, the materials utilized to form the top annular portion 302 and the bottom annular portion 304 are electrically conductive. Similarly, the thermal pads 300 can also be formed from any suitable metal material or combinations of metal materials. For example, the thermal pads 300 can be formed from copper materials, aluminum materials, or combinations thereof. Furthermore, the retaining members 312 can be formed from electrically conductive materials (e.g., metal materials). In certain embodiments, the retaining members 312 are formed from copper materials, such as beryllium copper and/or, optionally, silver-plated copper materials. Additionally, the mounting brackets 310 and mounting bracket faceplates 360 can also be formed from electrically conductive materials, such as metal materials. Connection of the top annular portion 302 to the bottom annular portion 304 with one or more electrically conductive mounting brackets 310, retaining members 312, and/or thermal pads 300, facilitates the formation of a shield 128 that is electrically conductive and/or in which certain components of the shield 128 are all electrically conductive and are, thus, electrically connected.

Figure 5:
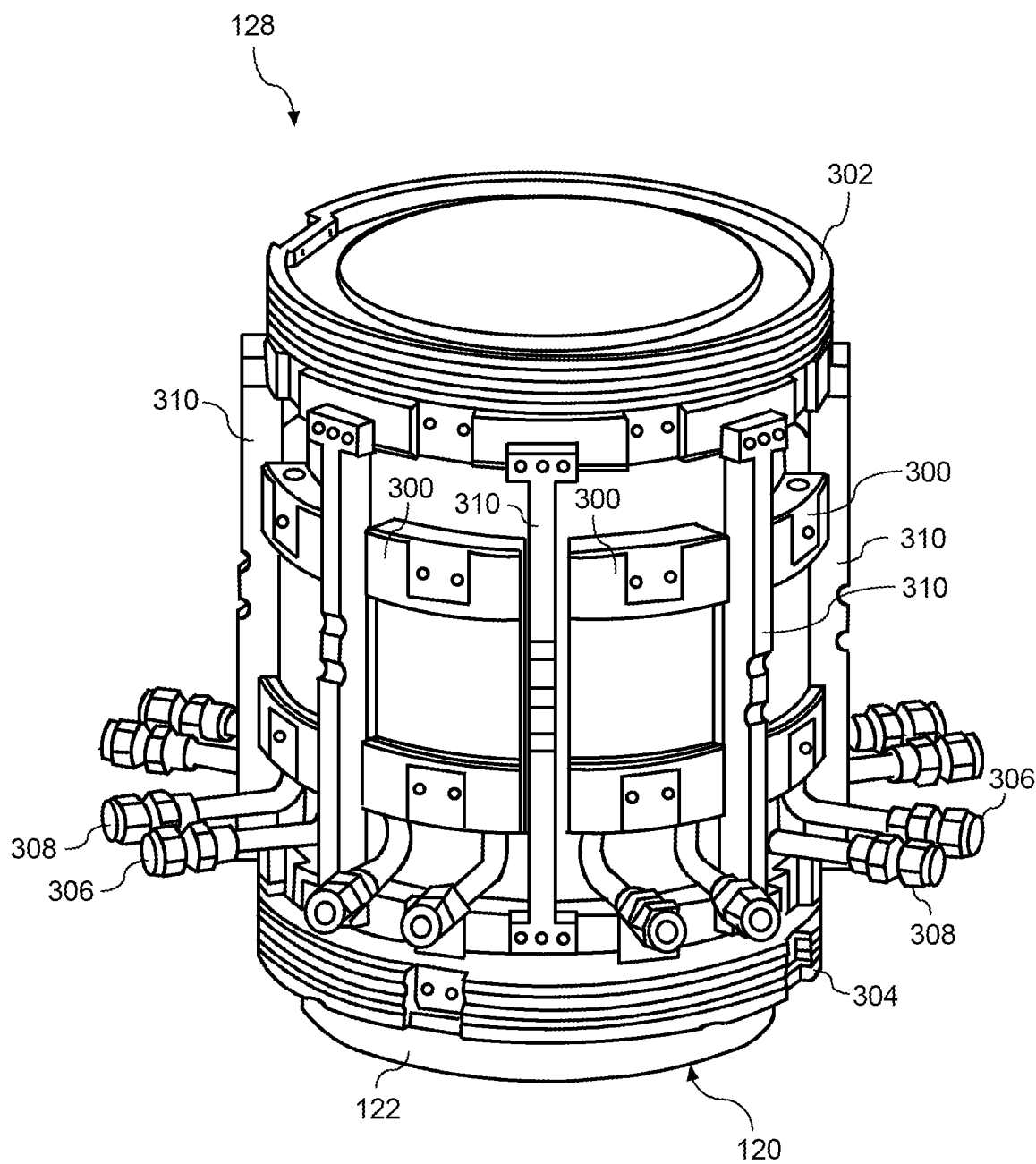
FIG. 5 depicts certain components of a shield connected by a plurality of example mounting brackets and having thermals pads disposed therebetween according to example embodiments of the present disclosure.
Figure 6:
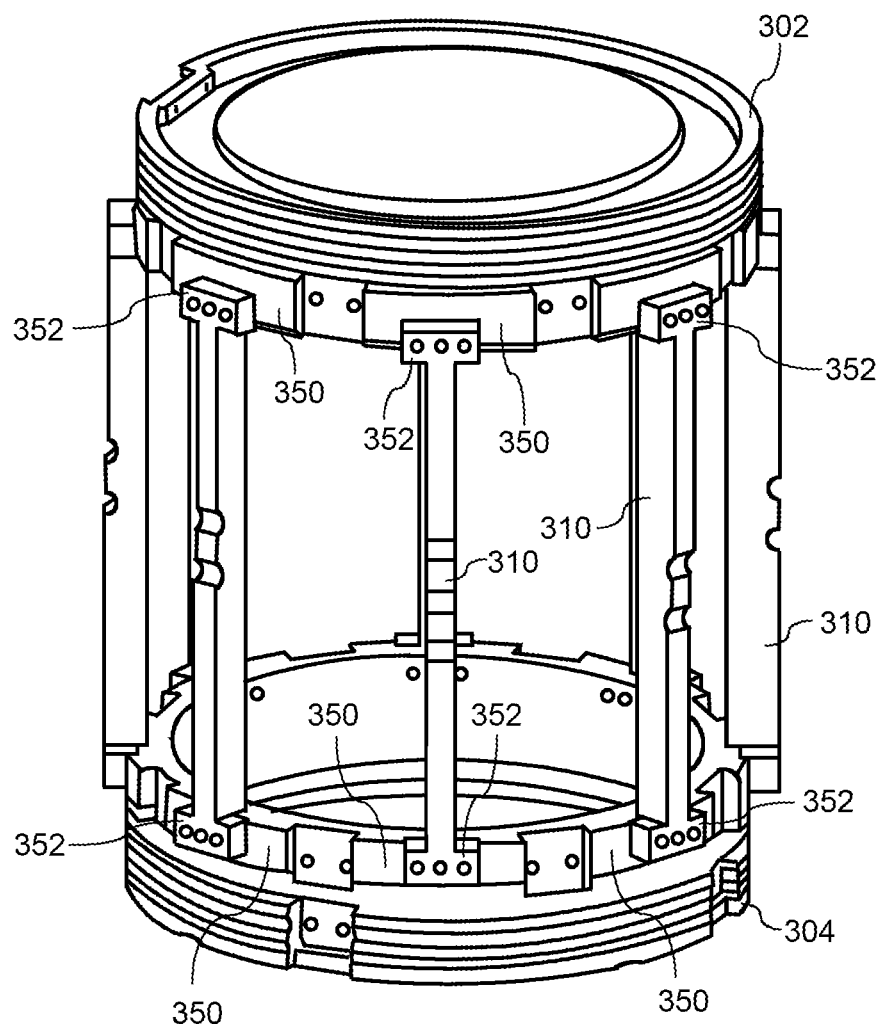
FIG. 6 depicts certain components of the shield connected by a plurality of example mounting brackets according to example embodiments of the present disclosure.
Figure 7:
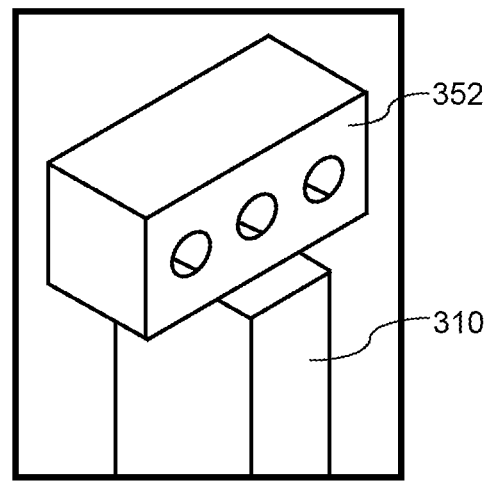
FIG. 7 depicts an enlarged view of one end of a mounting bracket according to example embodiments of the present disclosure.
Figure 8:
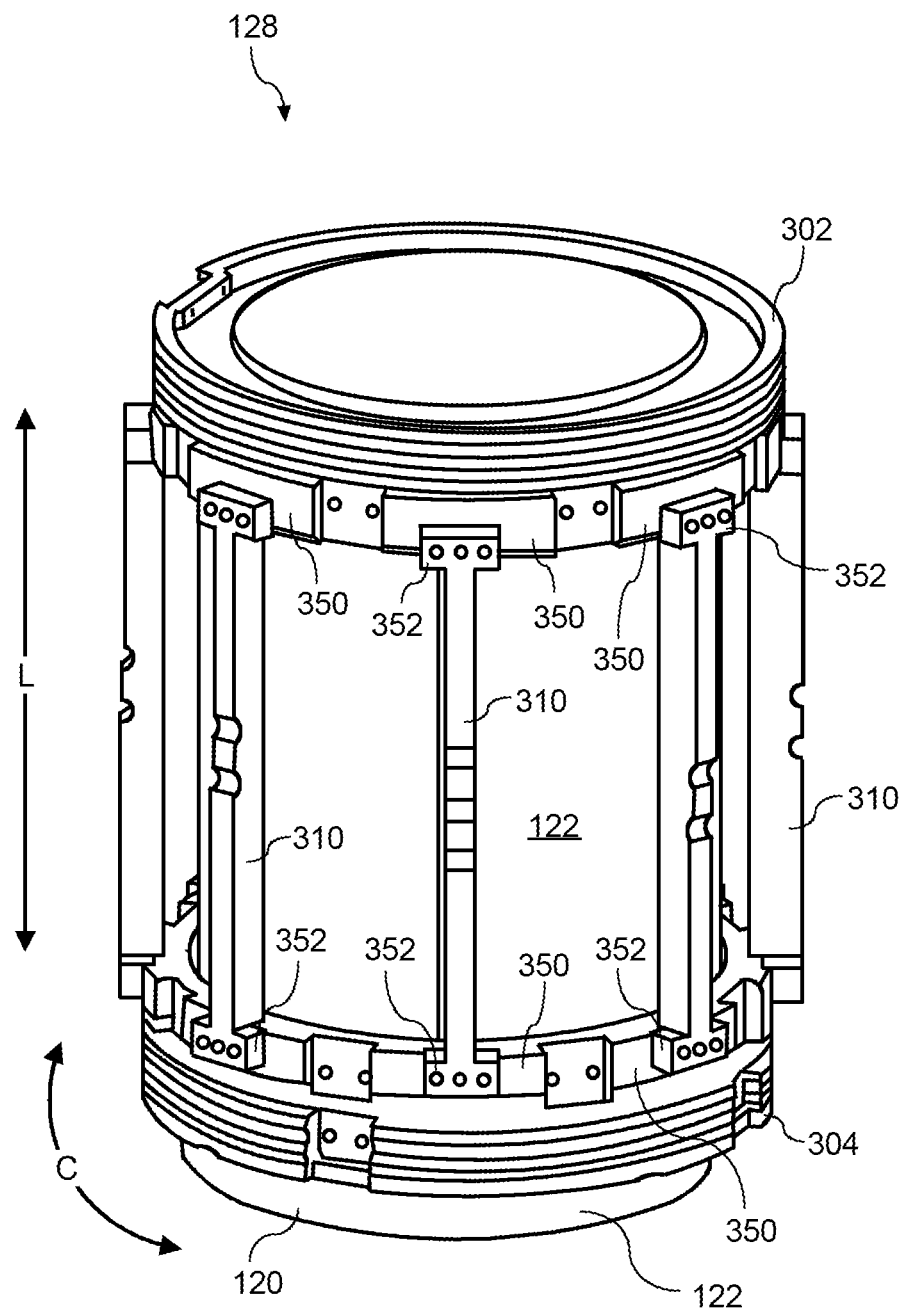
FIG. 8 depicts certain components of the shield connected by a plurality of example mounting brackets according to example embodiments of the present disclosure.

Also shown in FIG. 5, and more specifically in FIGS. 6-8, on or more mounting brackets 310 can be disposed between the top annular portion 302 and the bottom annular portion 304. The mounting brackets 310 can be configured to support the induction coil 130 as will be further discussed. The mounting brackets 310 can serve to electrically connect the top annular portion 302 to the bottom annular portion 304, such that multiple elements of the shield 128 are electrically connected. Furthermore, the mounting brackets 310 can be evenly spaced around the perimeter of the dielectric wall 122. The mounting brackets 310, in some examples, can be machined, printed, and/or molded (e.g., injection molded). As shown, the thermal pads 300 can be arranged within the spaces between the mounting brackets 310. Furthermore, the assembly of the top annular portion 302, bottom annular portion 304, and mounting brackets 310 can be placed around the dielectric wall of plasma chamber 120.

The top annular portion 302 and/or bottom annular portion 304 can be configured with additional mounting flanges 350 for mounting a plurality of the mounting brackets 310 as shown. Furthermore, each of the mounting brackets 310 can be configured with one or more struts 352 configured to engage the mounting flanges 350 in order to secure the mounting bracket 310 to the top annular portion 302 and/or bottom annular portion 304. For example, FIG. 7 illustrates an example embodiment of one end of a mounting bracket 310 having a strut 352 disposed thereon. The struts 352 can be fabricated such that the top annular portion 302 and the bottom annular portion 304 each rest against opposing shoulders of the struts 352, providing for uniform space between the top annular portion 302 and the bottom annular portion 304, and for ease of assembly. The struts 352 can be, in some examples, machined, printed, and/or molded (e.g., injection molded). As shown in FIG. 5, the top annular portion 302, bottom annular portion 304, and mounting brackets 310, can be placed around the dielectric wall 122 of a plasma chamber 120.

Figure 9:
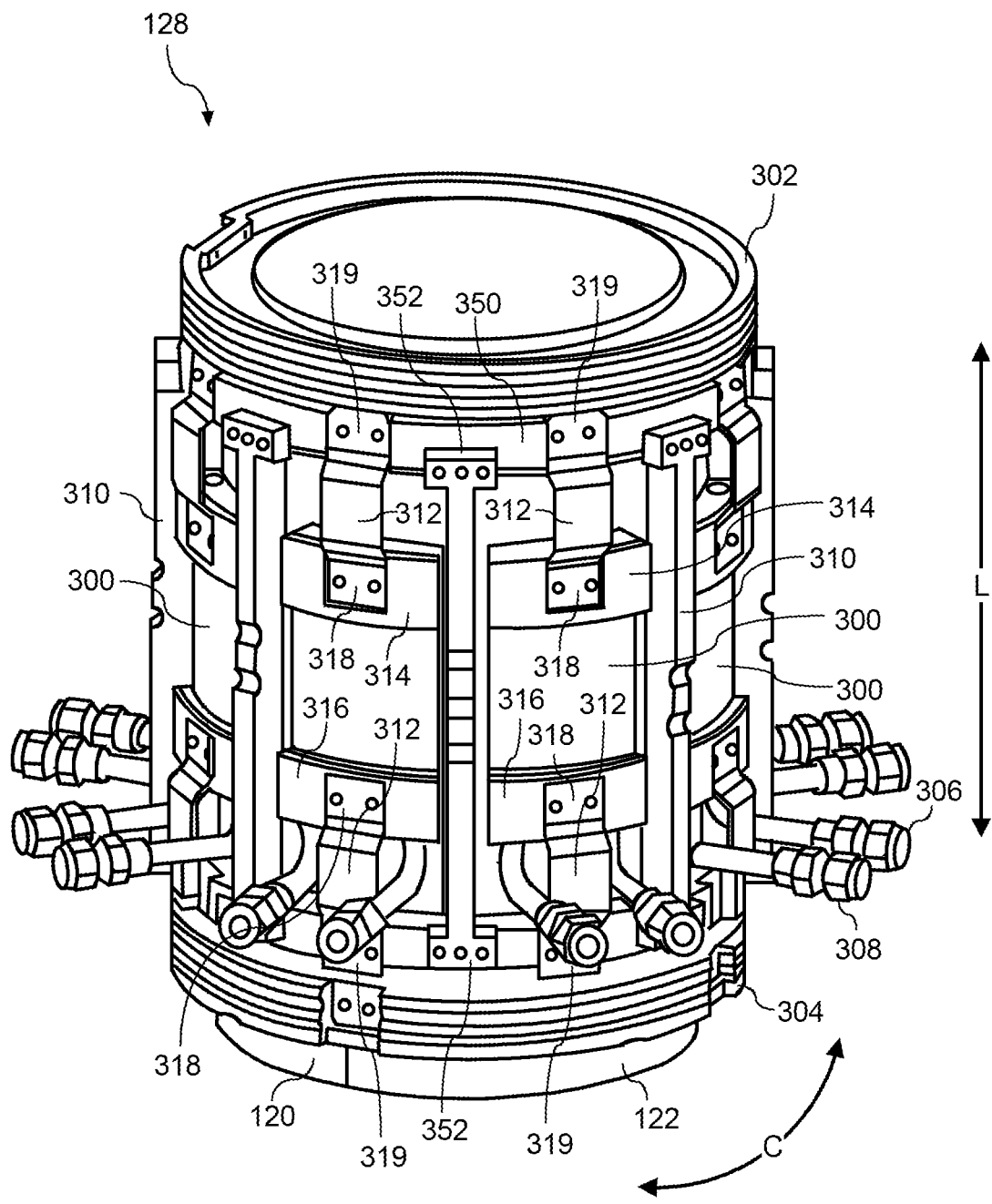
FIG. 9 depicts a plurality of retaining members affixed to the thermal pads according to example embodiments of the present disclosure.
Figure 10:
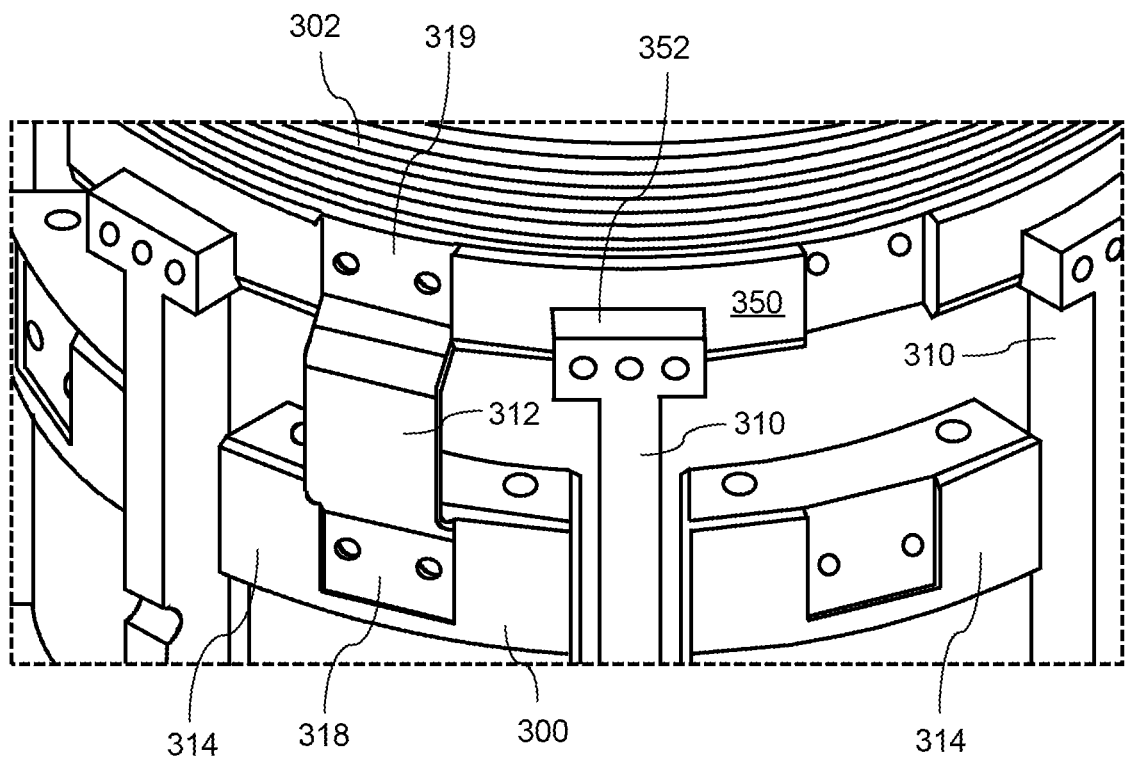
FIG. 10 depicts a enlarged view of the retaining members according to example embodiments of the present disclosure.

Now referring to FIGS. 2, 5, and 9, the thermal pads 300 can be coupled to either the top annular portion 302 or the bottom annular portion 304 utilizing one or more retaining members 312. The thermal pads 300 can be configured to include a top portion 314 and a bottom portion 316. The top portion 314 can be configured to be coupled a first end 318 of the retaining member 312, while a second end 319 of the retaining member 312 is coupled to either the top annular portion 302 or the bottom annular portion 304. For example, as shown specifically in FIG. 10, the top portion 314 of the thermal pad 300 includes a small indentation corresponding to generally to the size and shape of the first end 318 of the retaining member 312. The first end 318 of the retaining member 312 can be secured to the top portion 314 of the thermal pad 300 while the second end 319 of the retaining member 312 can be secured to a portion of the top annular portion 302. The retaining member 312 can be secured to both the thermal pad 300 and the annular portion 304 via any suitable fastener. Example of suitable fasteners include screws. Similarly, one or more retaining members 312 can be coupled to the bottom portion 316 of the thermal pad 300 and the bottom annular portion 304, to secure the bottom portion 316 of the thermal pad 300.

The retaining members 312 can bed position around the top annular portion 302 or the bottom annular portion 304 to provide for a uniform spacing between the top annular portion 302 and the bottom annular portion 304. Furthermore, the retaining members 312 can be positioned around the top annular portion 302 and/or the bottom annular portion 304 such that the thermal pads 300 are evenly distributed and/or are located with even spacing around the perimeter and/or the circumference of the dielectric wall 122 of the plasma chamber 120.

The retaining members 312 can be configured such that they provide elasticity with respect to the placement of the thermal pads 300 on the shield 128. For example, the retaining members 312 can be formed from any suitable material, such as a metal material (e.g., copper or beryllium copper or optionally silver-plated beryllium copper), such that the thermal pads 300 are held with compressive force against an external surface of the dielectric wall 122 of the plasma chamber 120. In embodiments, the retaining member 312 can include one or more elastic straps (e.g., copper straps) that can be positioned and secured to the top annular portion 302, bottom annular portion 304, and thermal pads 300 in order to hold the thermal pads 300 in place.

In some embodiments, the retaining members 312 and the corresponding thermal pads 300, are configured such that fully securing the retaining members 312 in position creates an internal torque within the retaining members 312, causing the retaining member 312 to compress the thermal pad 300 against the side wall 122. For instance, the ends of the retaining members 312 can be positioned to be radially offset with respect to their placement on the top annular portion 302 or bottom annular portion 304 and the thermal pads 300 can be radially offset, such that tightening the retaining member 312 causes the retaining member 312 to elastically deform. In other embodiments, the retaining member 312 could be preformed such that installation into substantially any fixture configuration would produce the desired compression response. The thickness of the retaining members 312 can also be adjusted in order to adjust the clamping pressure. In some embodiments, thermally conductive paste and/or other thermally conductive materials (e.g., adhesive pads) can be used at the interface between the thermal pads 300 and the side wall 122 (not shown). For example, in embodiments, additional materials (e.g., thermal paste or thermally conductive materials) can be used between the internal surface 322 of the thermal pad 300 and the dielectric wall 122 in order to facilitate heat transfer from the dielectric wall 122 into the thermal pad 300.

Additionally and/or alternatively, the retaining members 312 can be used to flexibly suspend the thermal pads 300 in order to allow for greater elastic deflection of the thermal pad 300 in a radial direction. Accordingly, the thermal pads 300 can expand and compress along with the dielectric wall 122 during operation of the apparatus 500. In such embodiments, the thermal pads 300 are able to expand and contract such that additional compressive forces are not applied by the thermal pads 300 to the dielectric wall 122, which can cause further stress and crack the dielectric wall 122.

Figure 11:
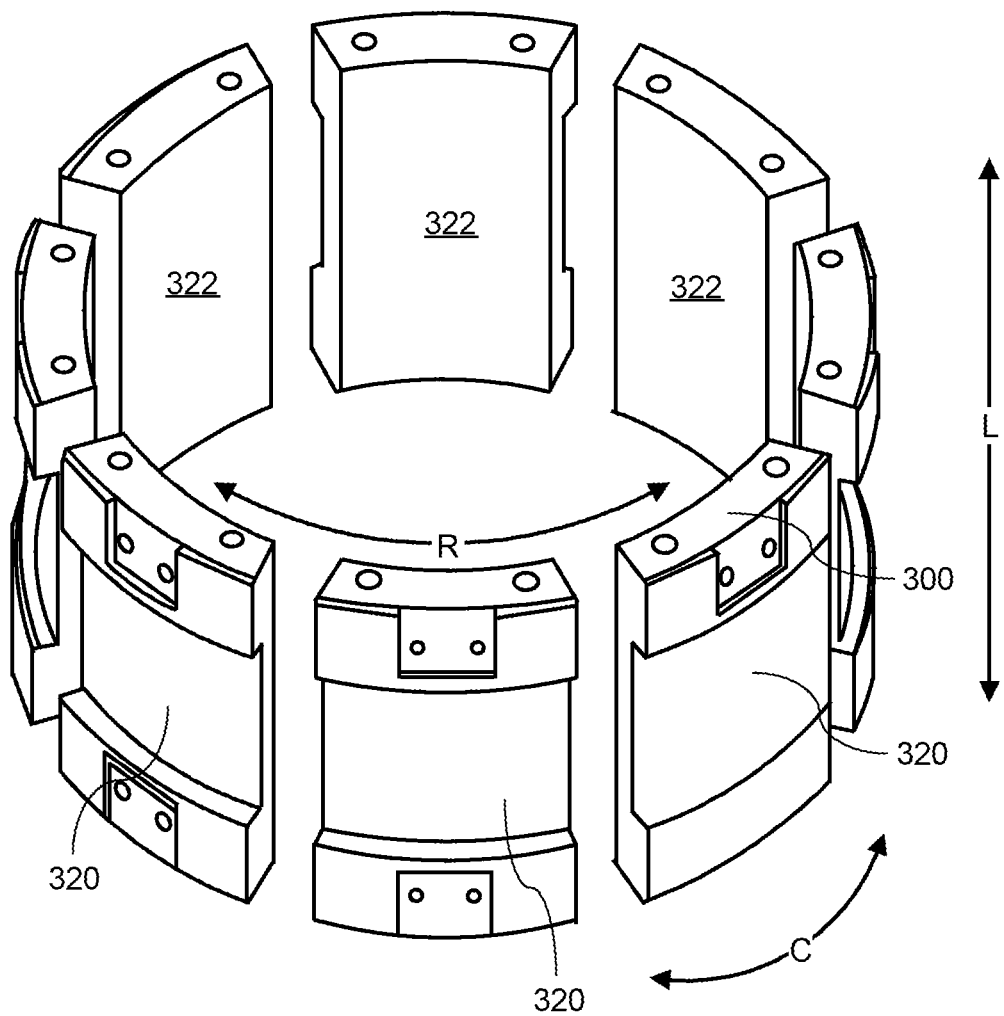
FIG. 11 depicts a plurality of example thermal pads according to example embodiments of the present disclosure arranged in a circular formation.

As shown in FIG. 11, the thermal pads 300 can include an external surface 320 generally facing away from the dielectric wall 122 and an internal surface 322 that faces and is pressed against the dielectric wall 122, when the thermal pads 300 are secured with one or more retaining members 312. Furthermore, in certain examples, the thermal pads 300 can be formed to conform to a desired radius on one face (e.g., the internal surface 322) to provide for more even contact pressure distribution when clamped against the dielectric side wall 122. For example, the thermal pads 300 can be formed with a desired radius or curvature, denoted by arrow R in order to provide for more even contact across the face (e.g., the internal surface 322) of the thermal pad 300 against the dielectric wall 122.

In addition to securely holding the thermal pads 300 against the dielectric wall 122, the retaining members 312 can also serve to electrically connect each of the thermal pads 300. For example, since each thermal pad 300 is connected to both the top annular portion 302 and the bottom annular portion 304 via one or more retaining members 312, the retaining members 312 can provide electrical connections between the top annular portion 302 and the bottom annular portion 304 via the retaining members 312 and the thermal pads 300. For example, in embodiments, each of the thermal pads 300 are electrically conductive and are in electrical communication with each other. Further, the thermal pads 300 can be in electrical communication with the top annular portion 302 and/or the bottom annular portion 304. Furthermore, the one or more retaining members 312 can be configured to electrically connect the thermal pads 300 to a reference potential, such as a ground potential. In certain embodiments, the reference potential can include a floating reference potential referenced to each of the plurality of thermal pads 300. For example, in certain embodiments, the top annular portion 302 and/or bottom annular portion 304 can be electrically connected to a reference potential (e.g., a ground potential), such that each of the thermal pads 300 is also electrically connected to the reference potential. Thus, in certain embodiments the retaining members 312 can electrically connect the respective thermal pad 300 to a reference potential.

Figure 12:
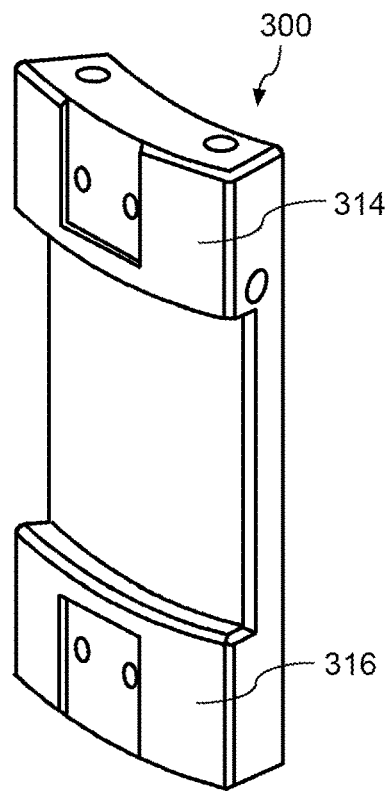
FIG. 12 depicts an example thermal pad according to example embodiments of the present disclosure with plugs selectively inserted into cooling channels.
Figure 13:
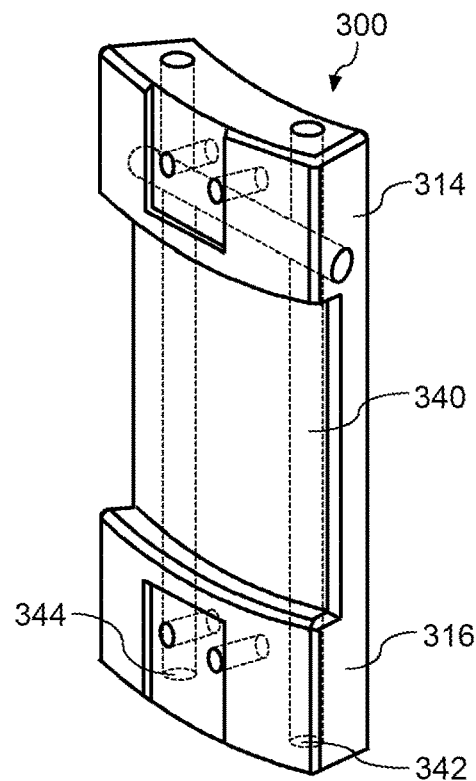
FIG. 13 depicts the example thermal pad of FIG. 12 in a transparent view according to example embodiments of the present disclosure.
Figure 14:
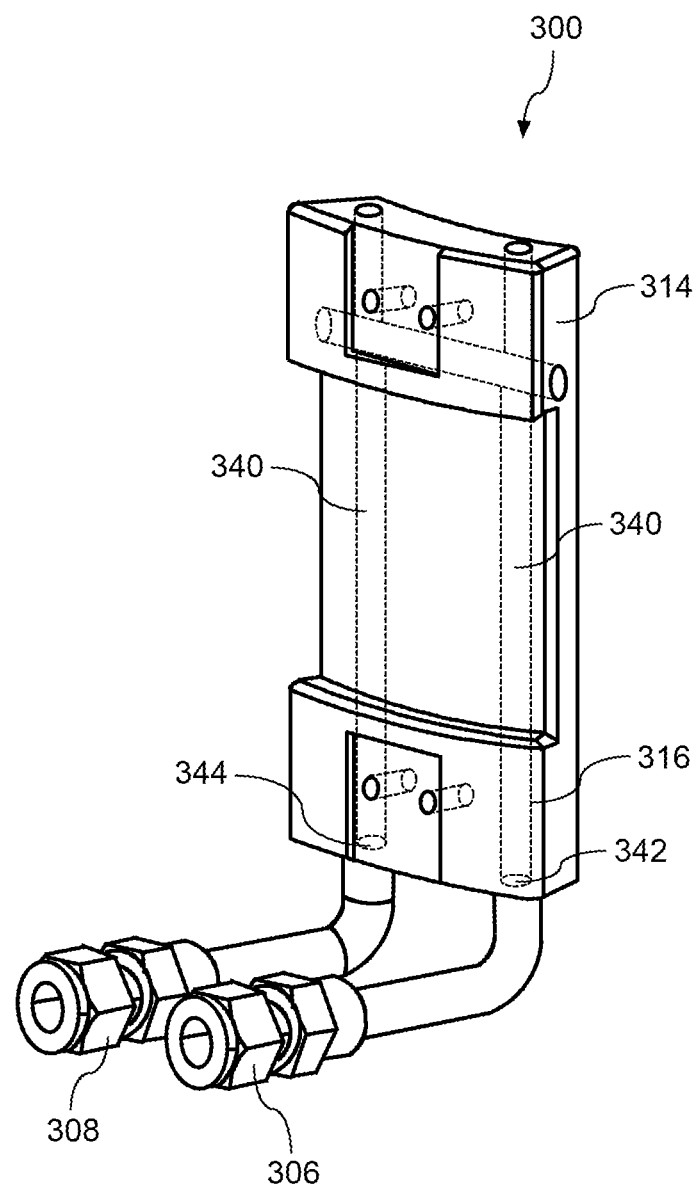
FIG. 14 depicts an example thermal pad having an inlet and outlet tubing connected thereto according to example embodiments of the present disclosure.

The thermal pads 300 can be operable connected to one or more heat sinks for removing heat from the one or more thermal pads 300. For example, FIGS. 12-14 illustrate example embodiments of thermal pads 300 that can be used according to the present disclosure. As shown, thermal pads 300 include a top portion 314 and a bottom portion 316, as previously discussed. Moreover, one or more cooling channels 340 can be disposed on or within the thermal pad 300 for removing heat from the thermal pad. The cooling channels 340 disposed within the thermal pad 300 can circulate a heat exchange fluid or other heat exchange mediums, in order to absorb and remove heat from the thermal pad 300. As shown in FIGS. 13-14, the cooling channels 340 can be disposed within the thermal pad 300 in any variety of patterns. In one example, the thermal pads 300 can be fabricated with internal cooling channels 340 using additive manufacturing techniques (e.g., laser sintering techniques). In certain other embodiments, the thermal pads 300 can also be fabricated using subtractive machining techniques. For instance, one arrangement of coolant channels, as shown in FIG. 13-14, can be formed in a sequence of drilling operations (e.g., three drilling operations). Optionally, certain portions of the cooling channels 340 can be strategically plugged (e.g., with press or threaded fit plugs, or with an injectable and/or curable compound) to provide for a U-shaped coolant channel. When arranged around the circumference of a plasma chamber 120, the thermal pads 300 can collectively provide even coverage of the cooling channels 340 around at least a portion of the dielectric wall 122 of the plasma chamber 120. Thus, should a hot spot be detected, flow of thermal exchange fluid through any one (or any group) of the thermal pads 300 can be adjusted to increase heat removal from the detected spot.

Each thermal pad 300 can include a cooling channel 340 having one or more ends, such as a first end 342 and a second end 344. As shown in FIG. 14, the first end 342 and second end 344 can be connected to ports, such as ports for introducing and/or removing heat exchange fluid. For example, the first end 342 can be coupled to a fluid inlet 306 such that thermal exchange fluid (e.g., fresh thermal exchange fluid) can be provided to the cooling channel 340. Fluid outlet 308 is coupled to the second end 344, such that heat exchange fluid (e.g., used thermal exchanged fluid) can be removed from the cooling channel 340. Additional inlet and outlet tubings for connecting the cooling channels 340 to the ports (e.g., inlet 306 and/or outlet 308) can be used. For instance, the inlet and outlet tubing can be attached via any suitable method, such as by brazing. The inlet 306 and outlet 308 can be connected with any necessary tubing, e.g., to a manifold for distribution of heat exchange fluid (e.g., coolant). In one example, flexible tubing (e.g., PTFE tubing) is used to connect the inlet 306 and/or outlet 308 to a manifold (e.g., an 8-to-1 manifold). Any plugs, if used, can also be sealed and/or brazed, if desired. The thermal exchange fluid utilized can be any known thermal exchange fluid including, but not limited to, water (e.g., deionized water), mixtures of glycol and water solutions, dielectric fluids (e.g., fluorocarbon-based fluids and/or polyalphaolefins), and/or mixtures thereof.

In embodiments, heat generated during operation of the induction coil 130 can produce a heat flux that is exposed to the plasma chamber 120 and/or the dielectric wall 122. Accordingly, in embodiments, use of the thermal pads 300 allows for heat flux from the dielectric wall 122 to be modulated (e.g., reduced) via one or more of the plurality of thermal pads 300. In such embodiments, the thermal pads 300 can be used to modulate heat flux such that a substantially uniform temperature gradient can be maintained within the dielectric wall 122 about a circumferential direction (C) and/or a longitudinal direction (L).

Figure 15:
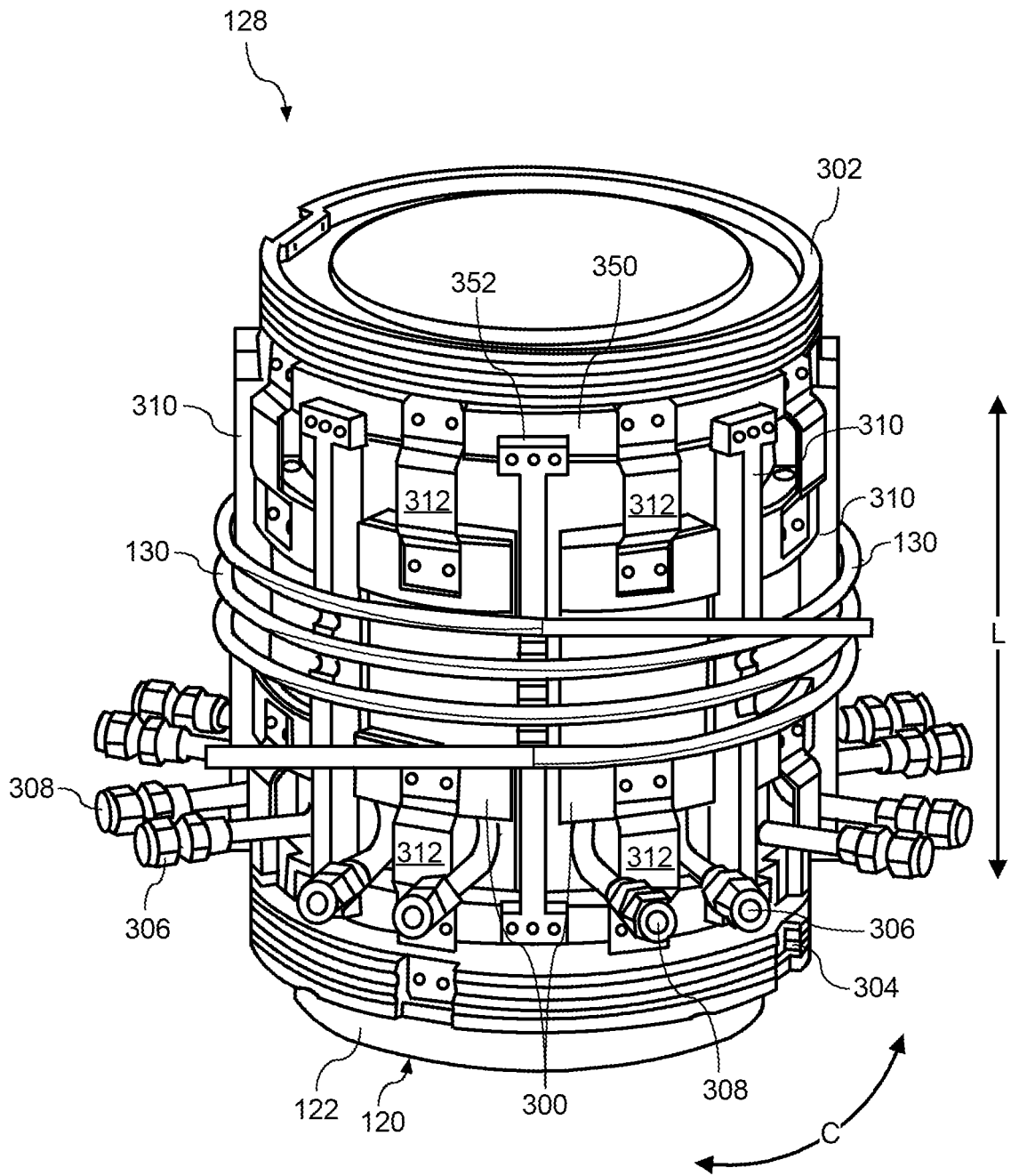
FIG. 15 depicts a shield encircled by an example inductive coil according to example embodiments of the present disclosure.
Figure 16:
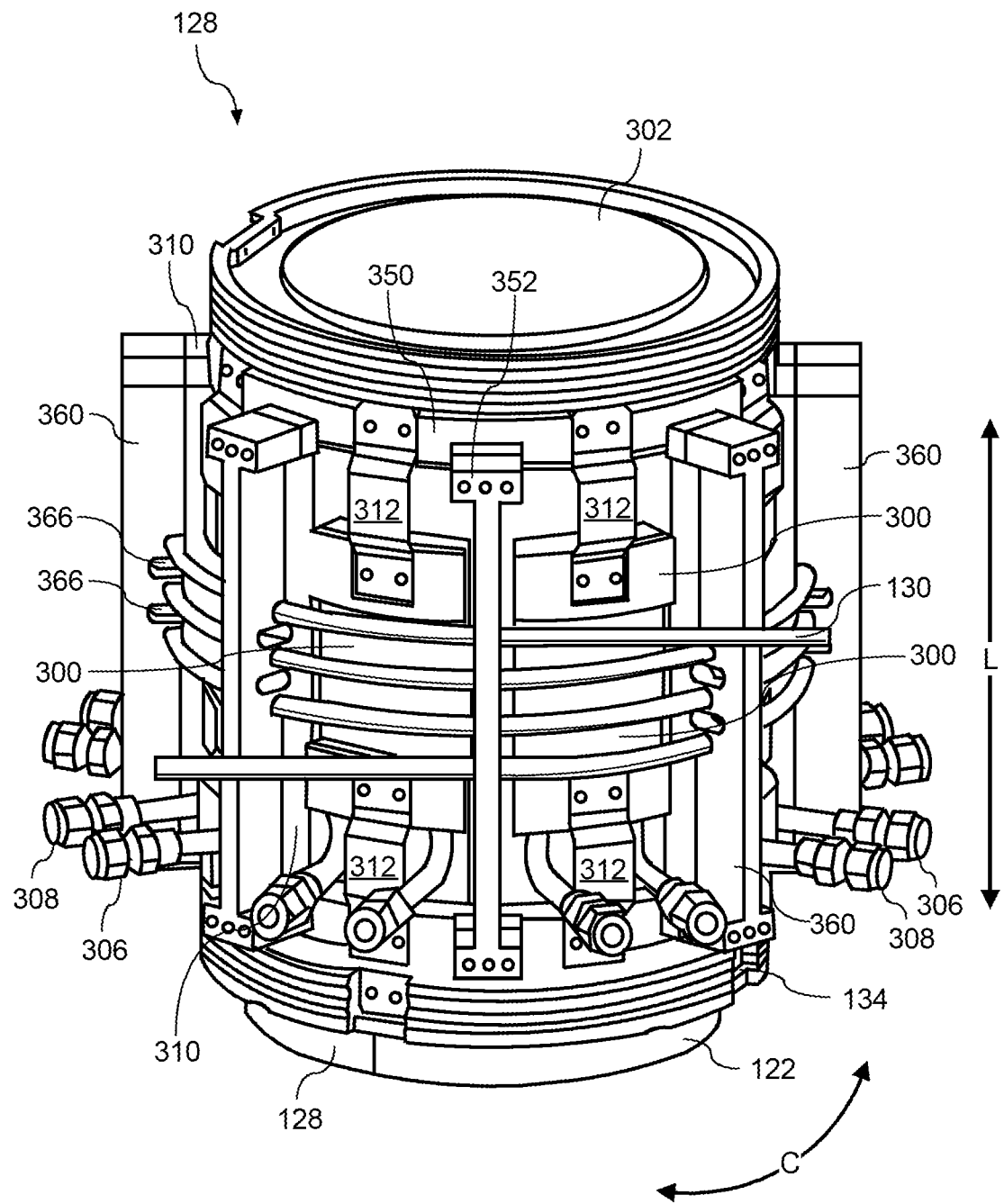
FIG. 16 depicts a shield encircled by an example inductive coil according to example embodiments of the present disclosure.
Figure 17:
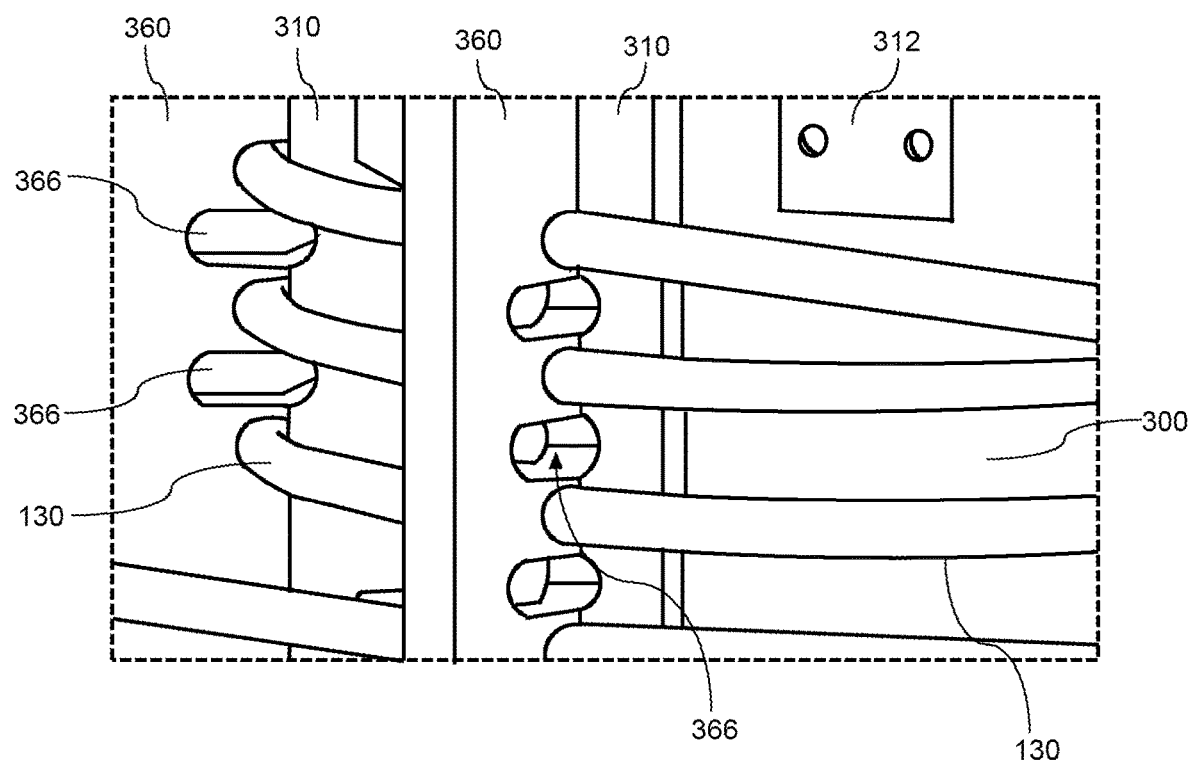
FIG. 17 depicts a detailed view of apertures in the mounting brackets according to example embodiments of the present disclosure.

Now referring to FIG. 15, in some embodiments, the induction coil 130 can be wrapped around the plasma chamber 120. For example, as shown in FIGS. 15-16, the induction coil 130 can include an induction coil assembly that is wrapped around at least a portion of the outer perimeter of the dielectric wall 122 and is held in place by one or more the mounting brackets 310. Additionally, mounting bracket faceplates 360 can be installed in order to adequately support and/or hold the induction coil 130 in place. While only one induction coil assembly containing one induction coil is shown, the disclosure is not so limited. In fact, any number of induction coils can be incorporated and utilized with the shield 128 as provided herein. For example, certain embodiments, can include at least two induction coils, such as at least three induction coils, such as at least four induction coils, etc. Furthermore, As shown, the induction coil 130 makes one or more complete turns (e.g., a plurality of turns) around the circumference and/or perimeter of the dielectric wall 122 of the plasma chamber 120 as shown. Furthermore, when the induction coil 130 is mounted to the mounting bracket 310 and the mounting bracket faceplates 360 are installed in order to securely hold the induction coil 130 in place, one or more apertures 366 can be disposed in the mounting bracket configuration as shown with more particularity in FIG. 17. The apertures 366 are configured to reduce coil arcing risk during operation of the induction coil 130.

Furthermore, in embodiments, the plurality of thermal pads 300 can be collectively characterized as having a total width in a circumferential direction with respect to the external surface of the dielectric wall 122, the total width spanning at least about 60% of the total circumference of the dielectric wall 122. Stated differently, the collective width of the plurality of thermal pads 300 disposed on the dielectric wall 122 covers at least about 60%, such as at least about 70%, such as at least about 80%, such as at least about 90%, or more of the circumferential direction of the dielectric wall 122. Furthermore, each of the thermal pads 300 can include a height in the longitudinal direction (L) that is generally greater than a height in the longitudinal direction (L) of the induction coil 130 of the inductively coupled plasma source. For example, in embodiments, the thermal pads 300 extend farther in the longitudinal than the induction coil 130 for the induction coil assembly.

Figure 18:
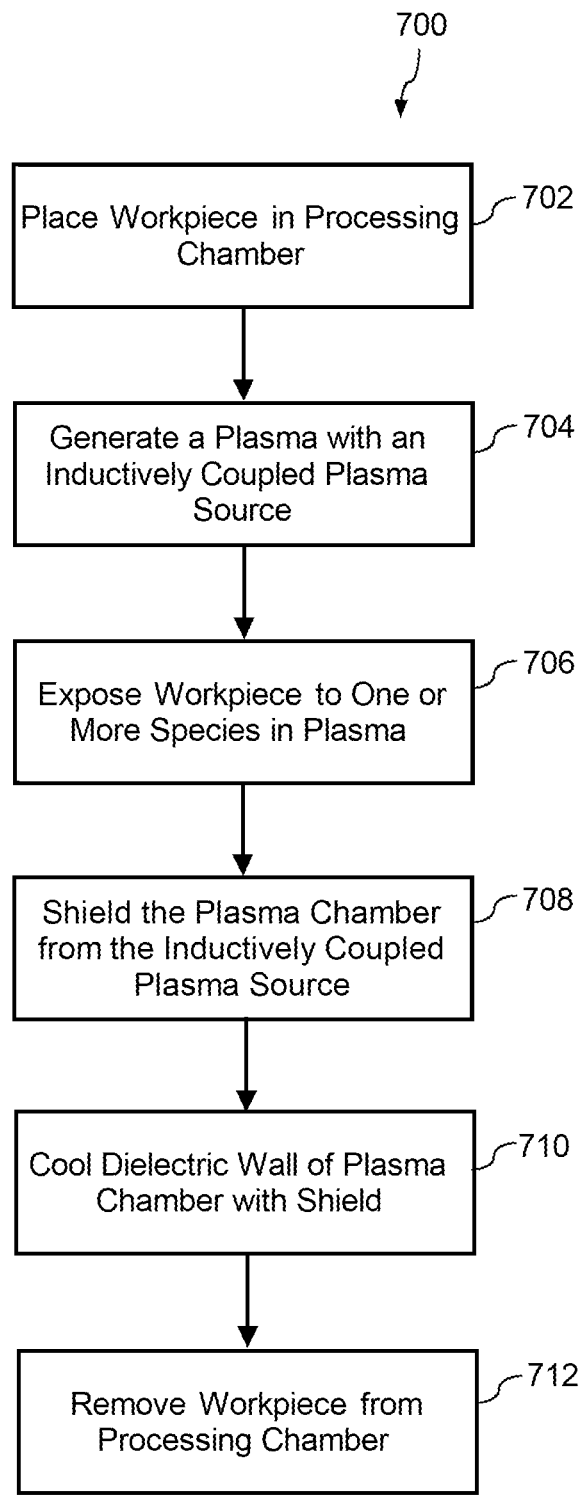
FIG. 18 depicts flowchart of an example method of processing a workpiece according to example embodiments of the present disclosure.

FIG. 18 depicts a flow diagram of one example method (700) according to example aspects of the present disclosure. The method (700) will be discussed with reference to the plasma processing apparatus 500 of FIG. 1 by way of example. The method (700) can be implemented in any suitable plasma processing apparatus. FIG. 18 depicts steps performed in a particular order for purposes of illustration and discussion. Those of ordinary skill in the art, using the disclosures provided herein, will understand that various steps of any of the methods described herein can be omitted, expanded, performed simultaneously, rearranged, and/or modified in various ways without deviating from the scope of the present disclosure. In addition, various steps (not illustrated) can be performed without deviating from the scope of the present disclosure.

At (702), the method can include placing a workpiece 114 in the processing chamber 110 of a plasma processing apparatus 500. For instance, the workpiece 114 can be placed on a workpiece support 112 disposed in the processing chamber 110. The processing chamber 110 can be separated from a plasma chamber 120 (e.g., separated by a separation grid assembly).

At (704), the method can include generating a plasma with an inductively coupled plasma source in the plasma chamber 120 of the plasma processing apparatus 500. For instance, a process gas can be admitted into the plasma chamber interior 125 from a gas source 150 via annular gas distribution channel 151 or other suitable gas introduction mechanism. The process gas is energized via an inductively coupled plasma source 135 to generate a plasma in a plasma chamber 120. For instance, induction coil 130 can be energized with RF energy from RF power generator 134 to generate a plasma in the plasma chamber interior 125. In some embodiments, the inductively coupled plasma source can be energized with pulsed power to obtain desired radicals with reduced plasma energy. The plasma can be used to generate one or more radicals from the process gas.

Optionally, the method can include filtering one or more species (e.g., ions) generated by the plasma to create a filtered mixture. In some embodiments, the one or more species can be filtered using a separation grid assembly 200 separating the plasma chamber 120 from a processing chamber 110 where the workpiece 114 is located. For instance, separation grid assembly 200 can be used to filter ions generated by the plasma. The separation grid 200 can have a plurality of holes. Charged particles (e.g., ions) can recombine on the walls in their path through the plurality of holes. Neutral species (e.g. radicals) can pass through the holes.

At (706), the method can include exposing the workpiece 114 to one or more species in the plasma and/or the filtered mixture to provide a treatment process for the workpiece 114. For example, exposing the workpiece 114 to one or more species generated in the plasma can result in material, chemical, and/or physical alteration of certain layers or features present on the workpiece 114. For example, in certain embodiments, the treatment process includes a plasma etch treatment process. The plasma etch treatment process can selectively remove one or more material layers from the workpiece 114. In other embodiments, the treatment process includes a plasma deposition process. For instance, the plasma deposition process can selectively deposit one or more material layer on the workpiece 114. Other plasma processes can be used to modify the material layers present on the workpiece. For example, plasma-based surface treatment processes can be utilized to modify the surface morphology of the workpiece or to modify the chemical composition of layers on the workpiece. Any other, known suitable plasma-based processing for workpieces can be performed on the workpiece 114.

At (708), the method can include shielding the plasma chamber 120 from the inductively coupled plasma source 135 with a shield 128. For example, shield 128 including thermal pads 300, retaining members 312, mounting brackets 310, top annular portion 302, and bottom annular portion 304 can be disposed around the dielectric wall 122 of plasma chamber 120. Portions of the shield 128 or the entire shield 128 can be electrically connected and connected to a reference potential (e.g., a ground potential) in order to reduce capacitive coupling of the induction coil 130 to the plasma generated.

At (710) the method includes cooling the dielectric wall 122 of plasma chamber 120 with shield 128. For example, the shield 128 can be operably maintained to modulate heat flux away from the dielectric wall 122 and/or plasma chamber 120 before, during, or after processing of workpiece 114. For example, in certain embodiments a particular dielectric wall temperature or parameters relating to the desired temperature difference between the dielectric wall 122, the plasma chamber 120, and/or the induction coil 130 can be provided to the controller 175. The controller 175 can then operate one or more components of the shield 128 (e.g., control the flow of thermal exchange fluid through the thermal pads 300) in order to maintain desired processing temperature parameters for the plasma chamber 12 and/or the dielectric wall 122. Furthermore, the controller 175 can operate a closed-loop system in order to maintain desired temperature inputs for the dielectric wall 122, plasma chamber 120, and/or induction coil 130 during processing. Thus, the controller 175 can modulate a thermal exchange fluid flow to one or more of the plurality of thermal pads 300 in order to modulate a heat gradient within the dielectric wall 122. The heat gradient can be reduced in the circumferential direction, longitudinal direction, or both, with respect to the plasma chamber 120.

At (712) the method can include removing the workpiece from the processing chamber 109. For instance, the workpiece 106 can be removed from workpiece support 112 in the processing chamber 110. The plasma processing apparatus can then be conditioned for future processing of additional workpieces.

One example embodiment of the present disclosure is directed to a plasma processing apparatus, comprising: a plasma chamber including a dielectric wall having an outer surface; an inductively coupled plasma source configured to generate a plasma in the plasma chamber; a shielding device disposed between the outer surface of the dielectric wall and the inductively coupled plasma source, the shielding device comprising: a top annular portion, a bottom annular portion, and a plurality of thermal pads coupled to top annular portion and/or bottom annular portion with one or more retaining members, wherein the one or more retaining members provide a compressive force to secure one or more of the plurality of thermal pads against the outer surface of the dielectric wall, wherein the plurality of thermal pads are configured to modulate a heat flux from the dielectric wall into the respective thermal pad.

In some embodiments, the top annular portion, the bottom annular portion, and/or the plurality of thermal pads comprise a metal material.

In some embodiments, the one or more retaining members comprise a metal material. For instance, in some embodiments, the one or more retaining members comprise copper, aluminum, or a combination thereof.

In some embodiments the apparatus comprises one or more mounting brackets extending from the top annular portion to the bottom annular portion, the mounting brackets configured to support the inductively coupled plasma source. For instance, the one or more mounting brackets include one or more apertures disposed therein to reduce coil arcing of the inductively coupled plasma source.

In some embodiments, the inductively coupled plasma source includes a source coil assembly, the source coil assembly configured to make one or more 360° turns about a perimeter of the dielectric wall. In some embodiments, the one or more thermal pads are disposed between the one or more turns of the source coil assembly and the dielectric wall.

In some embodiments, dielectric wall comprises quartz or a ceramic material.

In some embodiments, the thermal pads are operably coupled to one or more heat sinks for removing heat from the one or more thermal pads.

In some embodiments, the plurality of thermal pads comprise one or more cooling channels disposed therein configured to circulate a thermal exchange fluid for removing heat from the thermal pads. For instance, the one or more cooling channels comprise a first end coupled to a fluid inlet for providing fresh thermal exchange fluid to the one or more cooling channels and a second end coupled to a fluid outlet for removing used thermal exchange fluid from the one or more cooling channels.

In some embodiments, the one or more thermal pads comprise an external surface including a top portion and a bottom portion configured to be coupled the one or more retaining members, wherein a first end of a first retaining member is coupled to the top portion of the thermal pad and a second end of the first retaining member is coupled to the top annular portion of the shielding device, wherein a first end of a second retaining member is coupled to the bottom portion of the thermal pad and a second end of the second retaining member is coupled to the bottom portion of the shield in order to couple the thermal pad to the shielding device.

In some embodiments, each of the thermal pads are electrically conductive and are in electrical communication with each other.

In some embodiments, the heat flux from the dielectric wall is modulated via the one or more of the plurality of thermal pads to maintain a substantially uniform temperature gradient within the dielectric wall about a circumferential direction.

In some embodiments, the heat flux from the dielectric wall is modulated via the one or more of the plurality of thermal pads to maintain a substantially uniform temperature gradient within the dielectric wall about a longitudinal direction.

In some embodiments, the one or more retaining members are electrically conductive.

In some embodiments, the one or more retaining members comprise one or more copper straps.

In some embodiments, the one or more retaining members flexibly suspend the respective thermal pad to allow greater elastic deflection of the thermal pad in a radial direction.

In some embodiments, the one or more retaining members electrically connects the respective thermal pad to a reference potential. For instance, in some embodiments, the reference potential is a ground potential. In some embodiments, the reference potential is a floating potential referenced to each of the plurality of thermal pads.

In some embodiments, the plurality of thermal pads collectively are characterized by a total width in a circumferential direction with respect to the one or more surfaces of the plasma source, the total width spanning at least about 60% of a total circumference of the dielectric wall.

In some embodiments, the plurality of thermal pads include a height in a longitudinal direction that is greater than a height in the longitudinal direction of a coil assembly of the inductively coupled plasma source.

Another example embodiment of the present disclosure is directed to a plasma processing system, comprising: a plasma chamber including a dielectric wall having an outer surface; an inductively coupled plasma source configured to generate a plasma in the plasma chamber; a shielding device disposed between the outer surface of the dielectric wall and the inductively coupled plasma source, the shielding device comprising: a top annular portion, a bottom annular portion, and a plurality of thermal pads coupled to top annular portion and/or bottom annular portion with one or more retaining members, wherein the one or more retaining members provide a compressive force to secure one or more of the plurality of thermal pads against the outer surface of the dielectric wall, wherein the plurality of thermal pads are configured to modulate a heat flux from the dielectric wall into the respective thermal pad, wherein the thermal pads comprise one or more cooling channels disposed therein configured to circulate a thermal exchange fluid for removing heat from the thermal pads; a temperature measurement system configured to monitor the temperature of the dielectric wall; and a controller configured to perform one or more operations comprising (i) modulating a fluid flow of thermal exchange fluid to one or more of the plurality of thermal pads, and/or (ii) modulating a power input to the inductively coupled plasma source.

Another example embodiment is directed to a method of processing a workpiece, comprising: placing a workpiece on a workpiece support disposed in a processing chamber of a plasma processing apparatus; generating a plasma with an inductively coupled plasma source in a plasma chamber of the plasma processing apparatus, the plasma chamber including a dielectric wall; exposing the workpiece to one or more species in the plasma to provide a treatment process for the workpiece; and shielding the plasma chamber from the inductively coupled plasma source with a shielding device comprising: a top annular portion, a bottom annular portion, and a plurality of thermal pads coupled to top annular portion and/or bottom annular portion with one or more retaining members, wherein the one or more retaining members provide a compressive force to secure the one or more thermal pads against an outer surface of the dielectric wall, wherein the plurality of thermal pads are configured to modulate a heat flux from the dielectric wall into the respective thermal pad.

In some embodiments, the method includes cooling the dielectric wall of the plasma chamber with the shielding device.

In some embodiments, the method comprises modulating a thermal exchange fluid flow to one or more of the plurality of thermal pads to modulate a heat gradient within the dielectric wall. In some embodiments, the heat gradient is reduced in a circumferential direction, a longitudinal direction, or both, with respect to the plasma chamber.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A plasma processing apparatus, comprising:
   a plasma chamber including a dielectric wall having an outer surface;
   an inductively coupled plasma source configured to generate a plasma in the plasma chamber;
   a shielding device disposed between the outer surface of the dielectric wall and the inductively coupled plasma source, the shielding device comprising:
   a top annular portion,
   a bottom annular portion, and
   a plurality of thermal pads coupled to top annular portion and/or bottom annular portion with one or more retaining members, wherein the one or more retaining members provide a compressive force to secure one or more of the plurality of thermal pads against the outer surface of the dielectric wall, the one or more thermal pads comprise an external surface including a top portion and a bottom portion configured to be coupled the one or more retaining members, wherein a first end of a first retaining member is coupled to the top portion of the thermal pad and a second end of the first retaining member is coupled to the top annular portion of the shielding device, wherein a first end of a second retaining member is coupled to the bottom portion of the thermal pad and a second end of the second retaining member is coupled to the bottom portion of the shield in order to couple the thermal pad to the shielding device, wherein the plurality of thermal pads are configured to modulate a heat flux from the dielectric wall into the respective thermal pad.

2. The plasma processing apparatus of claim 1, wherein the top annular portion, the bottom annular portion, and/or the plurality of thermal pads comprise a metal material.

3. The plasma processing apparatus of claim 1, wherein the one or more retaining members comprise a metal material.

4. The plasma processing apparatus of claim 1, further comprising one or more mounting brackets extending from the top annular portion to the bottom annular portion, the mounting brackets configured to support the inductively coupled plasma source, wherein the one or more mounting brackets include one or more apertures disposed therein to reduce coil arcing of the inductively coupled plasma source.

5. The plasma processing apparatus of claim 1, wherein the inductively coupled plasma source includes a source coil assembly, the source coil assembly configured to make one or more 360° turns about a perimeter of the dielectric wall, wherein the one or more thermal pads are disposed between the one or more turns of the source coil assembly and the dielectric wall.

6. The plasma processing apparatus of claim 1, wherein the plurality of thermal pads comprise one or more cooling channels disposed therein configured to circulate a thermal exchange fluid for removing heat from the thermal pads.

7. The plasma processing apparatus of claim 6, wherein the one or more cooling channels comprise a first end coupled to a fluid inlet for providing fresh thermal exchange fluid to the one or more cooling channels and a second end coupled to a fluid outlet for removing used thermal exchange fluid from the one or more cooling channels.

8. The plasma processing apparatus of claim 1, wherein each of the thermal pads are electrically conductive and are in electrical communication with each other.

9. The plasma processing apparatus of claim 1, wherein the one or more retaining members are electrically conductive.

10. The plasma processing apparatus of claim 1, wherein the one or more retaining members flexibly suspend the respective thermal pad to allow greater elastic deflection of the thermal pad in a radial direction.

11. The plasma processing apparatus of claim 1, wherein the one or more retaining members electrically connects the respective thermal pad to a reference potential.

12. The plasma processing apparatus of claim 11, wherein the reference potential is a ground potential.

13. The plasma processing apparatus of claim 11, wherein the reference potential is a floating potential referenced to each of the plurality of thermal pads.

14. The plasma processing apparatus of claim 1, wherein the plurality of thermal pads collectively are characterized by a total width in a circumferential direction with respect to the one or more surfaces of the plasma source, the total width spanning at least about 60% of a total circumference of the dielectric wall.

15. The plasma processing apparatus of claim 1, wherein the plurality of thermal pads include a height in a longitudinal direction that is greater than a height in the longitudinal direction of a coil assembly of the inductively coupled plasma source.

16. A plasma processing system, comprising:
    a plasma chamber including a dielectric wall having an outer surface;
    an inductively coupled plasma source configured to generate a plasma in the plasma chamber;
    a shielding device disposed between the outer surface of the dielectric wall and the inductively coupled plasma source, the shielding device comprising:
    a top annular portion,
    a bottom annular portion, and
    a plurality of thermal pads coupled to top annular portion and/or bottom annular portion with one or more retaining members, wherein the one or more retaining members provide a compressive force to secure one or more of the plurality of thermal pads against the outer surface of the dielectric wall, the one or more thermal pads comprise an external surface including a top portion and a bottom portion configured to be coupled the one or more retaining members, wherein a first end of a first retaining member is coupled to the top portion of the thermal pad and a second end of the first retaining member is coupled to the top annular portion of the shielding device, wherein a first end of a second retaining member is coupled to the bottom portion of the thermal pad and a second end of the second retaining member is coupled to the bottom portion of the shield in order to couple the thermal pad to the shielding device, wherein the plurality of thermal pads are configured to modulate a heat flux from the dielectric wall into the respective thermal pad, wherein the thermal pads comprise one or more cooling channels disposed therein configured to circulate a thermal exchange fluid for removing heat from the thermal pads;

a controller configured to perform one or more operations comprising (i) modulating a fluid flow of thermal exchange fluid to one or more of the plurality of thermal pads, and/or (ii) modulating a power input to the inductively coupled plasma source.

* * * * *